United States Patent
Diener

(10) Patent No.: US 11,532,465 B2
(45) Date of Patent: Dec. 20, 2022

(54) LOW-PRESSURE PLASMA CHAMBER, LOW-PRESSURE PLASMA INSTALLATION AND METHOD FOR PRODUCING A LOW-PRESSURE PLASMA CHAMBER

(71) Applicant: Christof-Herbert Diener, Nagold (DE)

(72) Inventor: Christof-Herbert Diener, Nagold (DE)

( * ) Notice: Subject to any disclaimer, the term of this patent is extended or adjusted under 35 U.S.C. 154(b) by 129 days.

(21) Appl. No.: 16/280,028

(22) Filed: Feb. 19, 2019

(65) Prior Publication Data

US 2019/0259584 A1 Aug. 22, 2019

(30) Foreign Application Priority Data

Feb. 21, 2018 (DE) .................... 10 2018 103 949.2

(51) Int. Cl.
| | |
|---|---|
| *H01J 37/32* | (2006.01) |
| *B28B 11/00* | (2006.01) |
| *C03B 9/30* | (2006.01) |
| *C03B 11/12* | (2006.01) |
| *H05H 1/24* | (2006.01) |
| *H05H 1/46* | (2006.01) |

(52) U.S. Cl.
CPC ...... *H01J 37/32816* (2013.01); *B28B 11/008* (2013.01); *C03B 9/30* (2013.01); *C03B 11/122* (2013.01); *C03B 11/127* (2013.01); *H01J 37/32431* (2013.01); *H01J 37/32458* (2013.01); *H01J 37/32467* (2013.01); *H01J 37/3244* (2013.01); *H01J 2237/182* (2013.01); *H05H 1/2406* (2013.01); *H05H 1/46* (2013.01); *H05H 2242/00* (2013.01)

(58) Field of Classification Search
CPC .... H01J 15/00; H01J 37/32091; C23C 16/507
USPC ........ 118/723 E, 723 R; 156/345.43, 345.44, 156/345.45, 345.46, 345.47
See application file for complete search history.

(56) References Cited

U.S. PATENT DOCUMENTS

| | | | | |
|---|---|---|---|---|
| 4,289,598 A | * | 9/1981 | Engle | ...................... C23C 14/34 118/723 E |
| 4,804,431 A | | 2/1989 | Ribner | |

(Continued)

FOREIGN PATENT DOCUMENTS

| | | |
|---|---|---|
| CH | 228 540 A | 8/1943 |
| CN | 1298328 A | 6/2001 |

(Continued)

*Primary Examiner* — Rudy Zervigon
(74) *Attorney, Agent, or Firm* — Hackler Daghighian Martino & Novak

(57) ABSTRACT

A parallelepipedal low-pressure plasma chamber body of glass is disclosed. The low-pressure plasma chamber may have electrodes at opposing sides of the low-pressure plasma chamber body. Furthermore, the low-pressure plasma chamber may have at opposing sides a door and a rear wall closure. The door and rear wall closure may in each case have at least one media connection in order to achieve a uniform gas flow in the low-pressure plasma chamber. The door may be assembled on the collar of the low-pressure plasma chamber body which extends radially away from the longitudinal axis of the low-pressure plasma chamber body. The low-pressure plasma chamber body is preferably produced using the pressing method or blow-and-blow method, in an analogous manner to industrial glass bottle production.

16 Claims, 3 Drawing Sheets

(56) References Cited

U.S. PATENT DOCUMENTS

| | | | | |
|---|---|---|---|---|
| 4,938,788 A * | 7/1990 | Segawa | ............... | C03B 19/06 |
| | | | | 65/17.5 |
| 5,643,639 A | 7/1997 | Rudder et al. | | |
| 5,753,066 A * | 5/1998 | Kubota | ............ | H01J 37/32091 |
| | | | | 118/723 E |
| 5,823,011 A * | 10/1998 | Poting | ................ | C03B 11/00 |
| | | | | 65/305 |
| 5,846,329 A * | 12/1998 | Hori | ................ | H01J 37/32541 |
| | | | | 118/723 E |
| 6,143,124 A * | 11/2000 | Ahn | ................ | H01J 37/32009 |
| | | | | 118/623 |
| 6,543,380 B1 * | 4/2003 | Sung-Spitzl | ...... | H01J 37/32192 |
| | | | | 118/718 |
| 2003/0141285 A1 * | 7/2003 | Tachino | ............ | H01J 37/3211 |
| | | | | 219/121.54 |
| 2005/0230048 A1 * | 10/2005 | Donohoe | ............ | H01L 21/6719 |
| | | | | 156/345.48 |
| 2008/0017113 A1 * | 1/2008 | Goto | .................. | C23C 16/045 |
| | | | | 118/723 R |
| 2008/0127893 A1 * | 6/2008 | Tomasel | ............ | H01J 37/32495 |
| | | | | 118/723 E |
| 2010/0037822 A1 * | 2/2010 | Ishibashi | ............ | H01J 37/3244 |
| | | | | 118/723 E |
| 2010/0090573 A1 * | 4/2010 | Ko | ........................ | A61L 2/14 |
| | | | | 312/326 |
| 2010/0096393 A1 * | 4/2010 | Asahara | ............ | H05H 1/2406 |
| | | | | 220/660 |
| 2013/0320274 A1 * | 12/2013 | Walters | ............... | B82Y 40/00 |
| | | | | 252/511 |
| 2016/0056020 A1 * | 2/2016 | Lekobou | ................ | C23C 16/50 |
| | | | | 427/569 |
| 2017/0122663 A1 * | 5/2017 | Diener | ............... | H01L 21/6719 |

FOREIGN PATENT DOCUMENTS

| | | |
|---|---|---|
| CN | 1315587 A | 10/2001 |
| CN | 101336467 A | 12/2008 |
| CN | 101809708 A | 8/2010 |
| CN | 101835335 A | 9/2010 |
| CN | 102027811 A | 4/2011 |
| CN | 102270565 A | 12/2011 |
| CN | 204 145 866 U | 2/2015 |
| CN | 105992448 A | 10/2016 |
| CN | 106537551 A | 3/2017 |
| DE | 22 24 019 A1 | 11/1973 |
| DE | 28 40 844 A1 | 12/1979 |
| DE | 10 2014 213 942 A1 | 1/2016 |
| DE | 10 2016 109 343 A1 | 11/2017 |
| EP | 0 715 342 A2 | 6/1996 |
| JP | 2004 281 229 A | 10/2004 |
| WO | 2006 009281 A1 | 1/2006 |

* cited by examiner

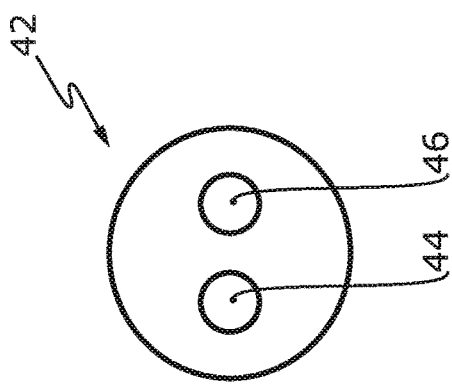
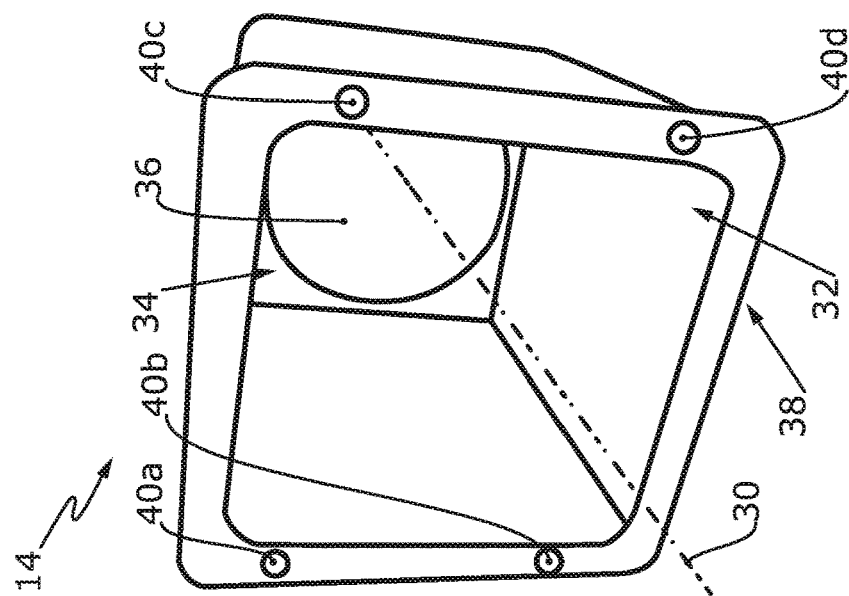
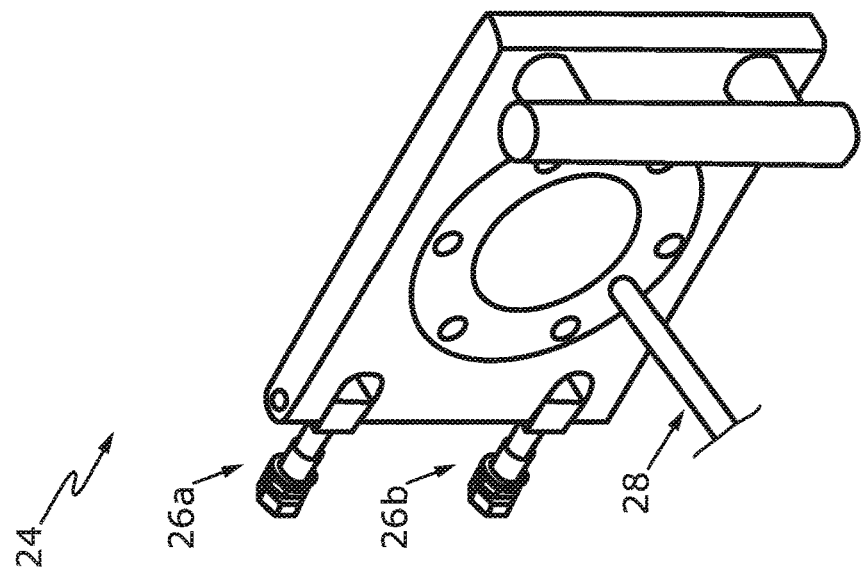
Fig. 2d
Fig. 2c
Fig. 2b

1

LOW-PRESSURE PLASMA CHAMBER, LOW-PRESSURE PLASMA INSTALLATION AND METHOD FOR PRODUCING A LOW-PRESSURE PLASMA CHAMBER

CROSS-REFERENCE TO RELATED APPLICATIONS

This application claims priority to German Patent Application No. 10 2018 103 949.2, filed Feb. 21, 2018, the entire contents of which are hereby incorporated in full by this reference.

DESCRIPTION

Field of the Invention

The present invention relates to plasma chambers. More particularly, the present invention relates to a low-pressure plasma chamber.

Background of the Invention

It is known to use low-pressure plasma installations in order to subject components (specimens/workpieces) to a vacuum treatment and/or plasma processing operation. Such low-pressure plasma installations have a low-pressure plasma chamber. A chemically and physically particularly inert low-pressure plasma chamber can be achieved when a low-pressure plasma chamber body is constructed from glass. With low-pressure plasma chamber bodies of metal, small quantities of metal can be sputtered. This means that in the plasma as a result of the bombardment with energy-rich ions, small quantities of metal are released and change into the gas phase. This may result in contamination of the components which are intended to be processed in the low-pressure plasma chamber.

The known low-pressure plasma chamber bodies of glass are hand-made. In this instance, prefabricated glass tubes which have a circular cross-section are used. The cross-section of the known low-pressure plasma chamber body is therefore circular.

As a result of the low-pressure plasma chamber body which is round in cross-section, however, the plasma becomes inhomogeneous. The inhomogeneous field line distribution with a low-pressure plasma chamber which is round in cross-section results in a poor and inhomogeneous plasma. The correction of such an inhomogeneous plasma is only possible in a complex manner by adapting the electrodes and/or controlling the electrodes.

U.S. Pat. No. 4,804,431 A discloses a plasma installation which is based on the use of a conventional microwave device. FIG. 10 of U.S. Pat. No. 4,804,431 A discloses a polygonal "inverted bell jar" 402 which is placed on a base plate 404 of aluminium. However, U.S. Pat. No. 4,804,431 A also teaches in column 2, lines 38-43 to use preferably tubular low-pressure plasma chamber bodies.

SUMMARY OF THE INVENTION

An object of the present invention is accordingly to provide in a structurally simple manner a low-pressure plasma chamber which enables a homogeneous plasma inside the low-pressure plasma chamber. Another object of the present invention is to provide a low-pressure plasma installation having such a low-pressure plasma chamber and a method for producing a low-pressure plasma chamber.

The object is achieved according to the invention by a low-pressure plasma chamber according to patent claim 1, a low-pressure plasma installation according to patent claim 9 and a method for producing a low-pressure plasma chamber according to patent claim 10. The dependent patent claims set out preferred developments.

The object according to the invention is consequently achieved by a low-pressure plasma chamber for plasma processing or vacuum treatment of a component at the inner side thereof. The low-pressure plasma chamber has a low-pressure plasma chamber body. The low-pressure plasma chamber body is constructed from glass. The low-pressure plasma chamber body has a polygonal cross-section.

The construction of a low-pressure plasma chamber body which is polygonal in cross-section enables the arrangement of linear and/or planar, non-curved electrodes on the low-pressure plasma chamber body in order to produce a plasma. A complex calculation and construction of the electrodes or a complex control of the electrodes is unnecessary. The polygonal low-pressure plasma chamber body consequently enables in a structurally simple manner the production of a homogeneous plasma inside the low-pressure plasma chamber body or the low-pressure plasma chamber.

A particularly homogeneous field line distribution is achieved since the cross-section of the low-pressure plasma chamber body is constructed to be quadrilateral, in particular rectangular, in a particularly preferred manner square (quadratic). A quadrilateral cross-section is intended in this instance to be understood to mean that the low-pressure plasma chamber body has four outer walls which radially delimit the inner space of the low-pressure plasma chamber body, wherein the four outer walls merge into each other via rounded or non-rounded corners.

The low-pressure plasma chamber may have electrodes and/or at least one coil in order to produce the plasma. Alternatively or additionally, the low-pressure plasma chamber may have a microwave generator.

In a further preferred manner, the low-pressure plasma chamber body extends in an elongate manner in the direction of the longitudinal axis thereof. In this instance, in order to achieve a particularly homogeneous field line distribution, the low-pressure plasma chamber body is preferably constructed, when viewed in the direction of the longitudinal axis, to be more than 40%, in particular more than 60%, in a particularly preferred manner more than 80% axially symmetrical with respect to the longitudinal axis thereof.

In another preferred embodiment of the invention, the cross-section of the low-pressure plasma chamber body is constructed along the longitudinal axis thereof to be more than 40%, in particular more than 60%, in a particularly preferred manner more than 80% identical. That is to say, the low-pressure plasma chamber body extends in this instance primarily in a uniform manner along the longitudinal axis thereof.

The low-pressure plasma chamber may have a door which can be opened and closed in a reversible manner.

The door may have at least one media connection, in particular in the form of a gas connection.

In another preferred embodiment of the invention, the low-pressure plasma chamber body has an opening having a collar, to which the door is secured. The collar or edge of the low-pressure plasma chamber body is in this instance preferably provided with at least one hole, in particular with a plurality of holes, for securing the door. The door can thereby be assembled and disassembled in a particularly simple manner.

The low-pressure plasma chamber body may have a rear wall of glass or porcelain. The rear wall may be partially or completely closed.

In a further preferred manner, the rear wall of the low-pressure plasma chamber body is partially open, in particular in a circular manner, wherein a plate-like, in particular circular-disc-like, rear wall closure of the low-pressure plasma chamber is inserted into a rear wall opening in the low-pressure plasma chamber body. The rear wall closure may have at least one media connection, in particular in the form of a connection for a vacuum pump. In a particularly preferred embodiment of the low-pressure plasma chamber, both the door and the rear wall opposite the door each have at least one media connection. Process gases may in this manner be introduced at one end of the low-pressure plasma chamber and drawn away at the other end. This enables a particularly homogeneous gas distribution, by means of which the plasma is further homogenised. If, however, media connections are provided only at one side of the low-pressure plasma chamber, process gases flow in only at this side and are immediately drawn away again, which leads to a more non-homogeneous plasma.

In a further preferred manner, the low-pressure plasma chamber body is constructed in an integral manner, that is to say, in one piece.

The low-pressure plasma chamber body may be constructed from porcelain. The porcelain may have kaolin, feldspar and quartz.

The low-pressure plasma chamber body may be constructed from halide glass, chalcogenide glass, phosphate glass, aluminosilicate glass, lead silicate glass, alkali-silicate glass, borosilicate glass, or alkaliborate glass. The low-pressure plasma chamber body is preferably constructed from soda-lime glass, borosilicate glass or quartz glass. Soda-lime glass is a mass-produced glass which is used to produce container glass and flat glass. Borosilicate glass is a very chemical-resistant and temperature-resistant glass which is used above all for glass devices in the laboratory, chemical process technology and in the household. It has the advantage that it does not become dielectrically heated at high frequencies. Quartz glass is a glass which in contrast to conventional glasses contains no additions of soda or calcium oxide, that is to say, comprises pure silicon dioxide.

The object according to the invention is further achieved by a low-pressure plasma installation having a low-pressure plasma chamber described herein. The low-pressure plasma installation has a vacuum pump which is connected to the low-pressure plasma chamber, a gas supply which is connected to the low-pressure plasma chamber and/or a plasma voltage supply which is connected to the low-pressure plasma chamber.

The object according to the invention is further achieved by a method for producing a low-pressure plasma chamber, in particular a low-pressure plasma chamber described herein, wherein the low-pressure plasma chamber body is produced with the pressing method or blow-and-blow method.

In the pressing method, a multi-component tool can be used, wherein the tool has a mould and a stamp. Preferably, in the pressing method, the multi-component tool further has a covering ring.

The tool components may in the method according to the invention be temperature-controlled differently. In a particularly preferred manner, the mould and the stamp are cooled. The covering ring may be cooled or heated.

In the blow-and-blow method according to the invention, in order to produce the low-pressure plasma chamber body, the method steps a) filling a premould; b) settle blowing; c) pre-blowing; and d) final blowing are preferably carried out.

The low-pressure plasma chamber body described in the context of the present invention is preferably produced by means of a method described herein, that is to say, using the pressing method or blow-and-blow method or the embodiments thereof.

BRIEF DESCRIPTION OF THE DRAWINGS

Further advantages of the invention will be appreciated from the description and the drawings. The features mentioned above and those set out below can also be used according to the invention individually per se or together in any combinations. The embodiments shown and described are not intended to be understood to be a definitive listing, but instead are of an exemplary nature for describing the invention.

In the drawings:

FIG. 2b is a perspective view of a door of a low-pressure plasma chamber according to the invention;

FIG. 2c shows a low-pressure plasma chamber body according to the invention;

FIG. 2d is a plan view of a plate-like rear wall closure for use in the low-pressure plasma chamber body according to FIG. 2c.

DETAILED DESCRIPTION OF THE PREFERRED EMBODIMENTS

Figure 1:
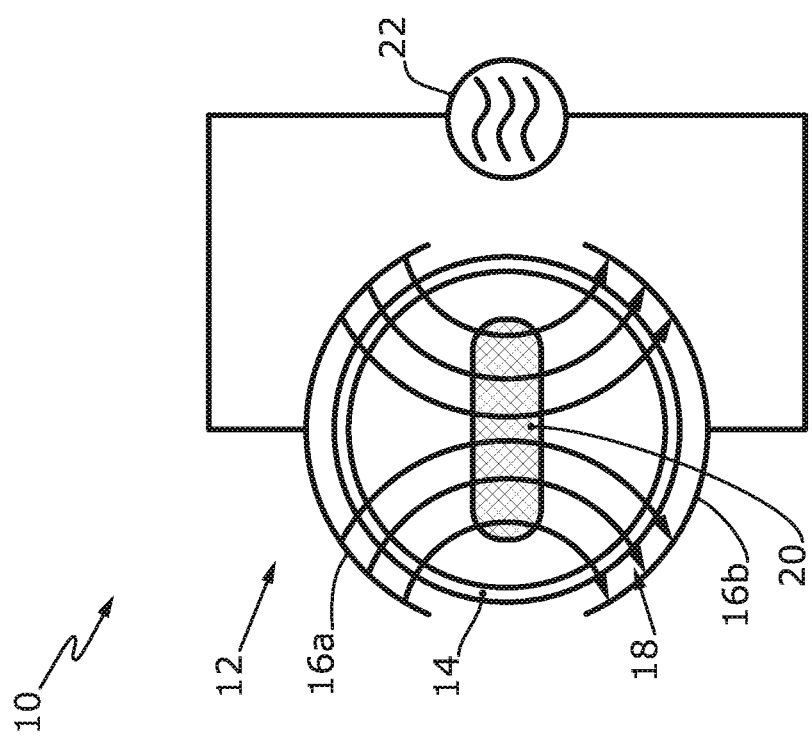
FIG. 1 shows a schematic low-pressure plasma installation according to the prior art.

FIG. 1a shows a low-pressure plasma installation 10 according to the prior art. The term "prior art" is intended to be understood to mean that low-pressure plasma installations of the type according to FIG. 1a are known to the Applicant. However, this is not necessarily published prior art.

The low-pressure plasma installation 10 has a low-pressure plasma chamber 12 with a low-pressure plasma chamber body of glass. The low-pressure plasma chamber body 14 has a round, in this instance circular, cross-section. Electrodes 16a, 16b surround the low-pressure plasma chamber body 14 in a curved manner so that field lines 18 are present in a curved manner in the low-pressure plasma chamber 12. A component 20 for plasma processing is introduced in the low-pressure plasma chamber 12. The plasma is produced by means of a plasma voltage supply 22.

As a result of the curved field lines 18, the plasma ignited in the low-pressure plasma chamber body 14 is inhomogeneous. An object of the invention in this regard is to provide a homogeneous plasma, wherein the low-pressure plasma chamber body 14 should be constructed to be chemically and physically inert to the greatest possible extent and the electrodes should be constructed in a structurally simple manner.

Figure 2A:
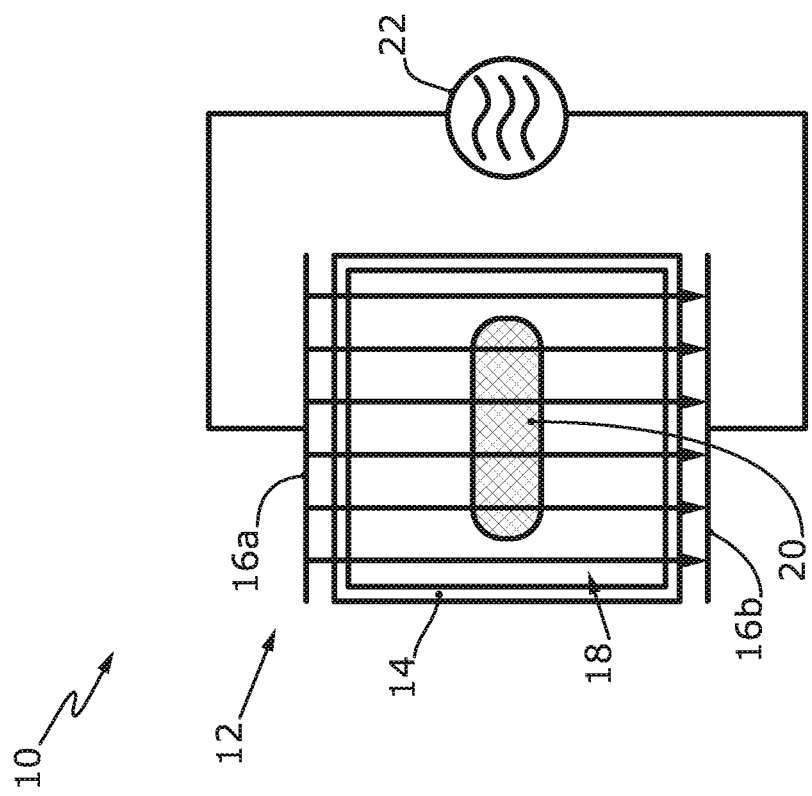
FIG. 2a shows a low-pressure plasma installation according to the invention.

FIG. 2a is a schematic view of a low-pressure plasma installation 10 according to the invention. The low-pressure plasma installation 10 has a low-pressure plasma chamber 12 having a low-pressure plasma chamber body 14 in the form of a glass body which is rectangular in cross-section. The low-pressure plasma chamber body 14 is flanked by electrodes 16a, 16b. The electrodes 16a, 16b are preferably arranged facing each other on the low-pressure plasma chamber body 14. The electrodes 16a, 16b are preferably constructed in a planar manner. Linear field lines 18 are thereby produced. A component 20 which is introduced into the low-pressure plasma chamber 12 is subjected to a homogeneous plasma. The plasma is preferably produced by means of a plasma voltage supply 22.

The low-pressure plasma chamber 12 according to FIG. 2a is shown in FIGS. 2b to 2d-without the electrodes 16a, 16b or without the plasma voltage supply 22—in the form of an exploded illustration.

FIG. 2b shows a door 24 with screw connections 26a, 26b. The door 24 may have a first media connection 28 for connecting a gas supply and/or a vacuum pump.

FIG. 2c shows the low-pressure plasma chamber body 14 of glass. The low-pressure plasma chamber body 14 is constructed in one piece. It is preferably constructed in a parallelepipedal manner. The low-pressure plasma chamber body 14 preferably extends in the direction of the longitudinal axis 30 thereof. When viewed in the direction of the longitudinal axis 30, the low-pressure plasma chamber body 14 has at one side an opening 32 and, facing the opening 32, a rear wall 34. In the rear wall 34, a rear wall opening 36 may be constructed.

The opening 32 may surround a collar 38 in which at least one hole 40a, 40b, 40c, 40d, in this instance a plurality of holes 40a-40d, is/are constructed. In this instance, the door 24 shown in FIG. 2b can be assembled by means of the screw connections 26a, 26b in the holes 40a, 40b.

FIG. 2d shows a rear wall closure 42 which can be inserted into the rear wall opening 36 according to FIG. 2c. The rear wall closure 42 may have a second media connection 44 and a third media connection 46. The media connections 44, 46 can be constructed to connect a gas supply and/or a vacuum pump.

Figure 3:
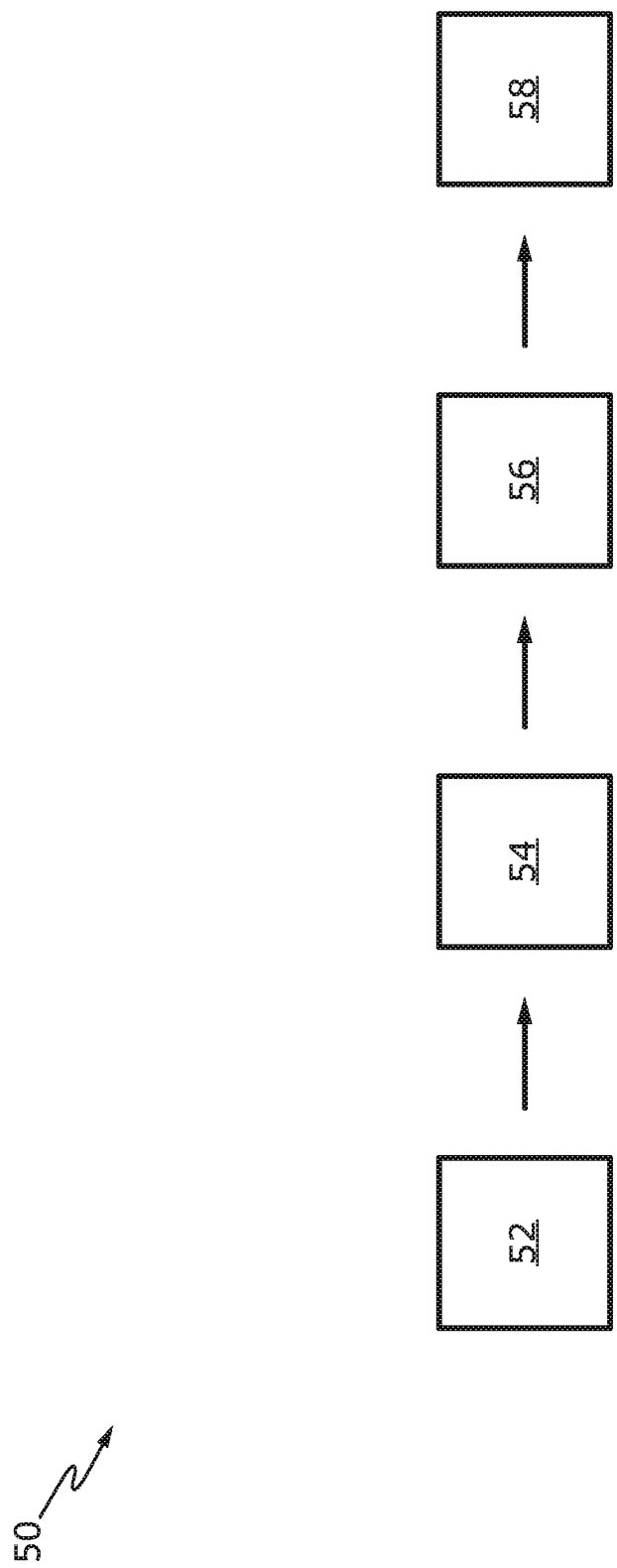
FIG. 3 is a schematic illustration of a method according to the invention for producing the low-pressure plasma chamber body according to FIG. 2c.

FIG. 3 shows a method 50 for producing the low-pressure plasma installation 10 according to FIG. 2a.

In a method step 52, glass is poured into a tool in order to produce the low-pressure plasma chamber body 14 according to FIG. 2c. In a method step 54, a pressing method or a blow-and-blow method is then carried out. In this case, the production of the low-pressure plasma chamber body 14 is preferably carried out in an analogous manner to the mass production of glass bottles.

In a method step 56, the door 24 illustrated in FIG. 2b and the rear wall closure 42 illustrated in FIG. 2d are mounted on the low-pressure plasma chamber body 14 according to FIG. 2d. The low-pressure plasma chamber 12 schematically illustrated in FIG. 2a is thereby obtained.

In a method step 58, a vacuum pump, a gas supply and/or a plasma voltage supply 22 is/are connected to the low-pressure plasma chamber 12 in order to obtain a low-pressure plasma installation 10.

When viewing all the Figures of the drawings together, the invention on the whole relates to a preferably parallelepipedal low-pressure plasma chamber body 14 of glass. The invention further relates to a low-pressure plasma chamber 12 having such a low-pressure plasma chamber body 14. The low-pressure plasma chamber 12 may have electrodes 16a, 16b at opposing sides of the low-pressure plasma chamber body 14. Furthermore, the low-pressure plasma chamber 12 may have at opposing sides a door 24 and a rear wall closure 42. The door 24 and rear wall closure 42 may in each case have at least one media connection 28, 44, 46 in order to achieve a uniform gas flow in the low-pressure plasma chamber 12. The door 24 may be mounted on a collar 38 of the low-pressure plasma chamber body 14 which extends radially away from the longitudinal axis 30 of the low-pressure plasma chamber body 14. The low-pressure plasma chamber body 14 is preferably produced using the pressing method or blow-and-blow method, in an analogous manner to industrial glass bottle production.

LIST OF REFERENCE NUMERALS

10 Low-pressure plasma installation
12 Low-pressure plasma chamber
14 Low-pressure plasma chamber body
16a Electrode
16b Electrode
18 Field lines
20 Component
22 Plasma voltage supply
24 Door
26a Screw connection
26b Screw connection
28 First media connection
30 Longitudinal axis of the low-pressure plasma chamber body
32 Opening
34 Rear wall
36 Rear wall opening
38 Collar
40a Hole
40b Hole
40c Hole
40d Hole
42 Rear wall closure
44 Second media connection
46 Third media connection
50 Method for producing a low-pressure plasma installation 10
52 Method step
54 Method step
56 Method step
58 Method step

What is claimed is:

1. A low-pressure plasma chamber for a low-pressure plasma installation for plasma processing of a component in the low-pressure plasma chamber, the low-pressure plasma chamber comprising:
 a low-pressure plasma chamber body of glass, the glass not including quartz, wherein the low-pressure plasma chamber body is produced with a pressing method, wherein the low-pressure plasma chamber body is integrally formed as one piece;
 wherein a cross-section of the low-pressure plasma chamber body is constructed to be quadrilateral in regards to a plurality of inside surfaces and a plurality of outside surfaces;
 wherein the low-pressure plasma chamber has a door which can be opened and closed in a reversible manner without tools; and
 a pair of electrodes spaced apart and disposed facing one another adjacently located on an outside of a respective flat chamber wall configured to produce a homogeneous field line distribution of plasma within the low-pressure plasma chamber, wherein the pair of electrodes are non-curved and wherein the pair of electrodes and any additional electrodes are not disposed within the low-pressure plasma chamber.

2. The low-pressure plasma chamber according to claim 1, wherein the quadrilateral cross-section of the low pressure plasma chamber body is constructed to be rectangular.

3. The low-pressure plasma chamber according to claim 1, wherein the low-pressure plasma chamber body extends in an elongate manner in the direction of a longitudinal axis thereof.

4. The low-pressure plasma chamber according to claim 3, wherein the cross-section of the low-pressure plasma chamber body is constructed along the longitudinal axis thereof to be symmetrical.

5. The low-pressure plasma chamber according to claim 1, wherein the door has at least one media connection.

6. The low-pressure plasma chamber according to claim 1, wherein the low-pressure plasma chamber body has an opening having a collar, to which the door of the low-pressure plasma chamber is secured to at least one hole in the collar.

7. The low-pressure plasma chamber according to claim 5, wherein the low-pressure plasma chamber body has an at least partially closed rear wall of glass.

8. The low-pressure plasma chamber according to claim 7, wherein the rear wall of the low-pressure plasma chamber body has a plate-like rear wall closure which is inserted into a rear wall opening in the low-pressure plasma chamber body, wherein the rear wall closure has at least a second media connection.

9. The low-pressure plasma chamber according to claim 1, wherein the low-pressure plasma chamber body is constructed from soda-lime glass or borosilicate glass and not quartz glass.

10. The low-pressure plasma installation having the low-pressure plasma chamber according to claim 1, wherein the low-pressure plasma installation has a vacuum pump which is connected to the low-pressure plasma chamber, a gas supply which is connected to the low-pressure plasma chamber and/or a plasma voltage supply which is connected to the low-pressure plasma chamber.

11. A method for producing the low-pressure plasma chamber according to claim 1, wherein the low-pressure plasma chamber body is produced with a pressing method or a blow-and-blow method.

12. The method according to claim 11, wherein in the pressing method a multi-component tool is used, wherein the tool has a mould, a stamp and a covering ring.

13. The method according to claim 12, wherein the tool components of the multi-component tool are temperature-controlled differently, wherein the mould and the stamp are cooled and the covering ring is heated.

14. The method according to claim 11, wherein the blow-and-blow method comprises the steps of:
a) filling a premould;
b) settle blowing;
c) pre-blowing; and
d) final blowing.

15. The low-pressure plasma chamber according to claim 1, wherein in the pressing method a multi-component tool is used, wherein the tool has a mould, a stamp and a covering ring.

16. The low-pressure plasma chamber according to claim 15, wherein the tool components of the multi-component tool are temperature-controlled differently, wherein the mould and the stamp are cooled and the covering ring is heated.

* * * * *